(12) United States Patent
Nishiyama et al.

(10) Patent No.: US 7,745,802 B2
(45) Date of Patent: *Jun. 29, 2010

(54) SPECIMEN HOLDER, SPECIMEN INSPECTION APPARATUS, SPECIMEN INSPECTION METHOD, AND METHOD OF FABRICATING SPECIMEN HOLDER

(75) Inventors: Hidetoshi Nishiyama, Tokyo (JP); Mitsuru Koizumi, Tokyo (JP)

(73) Assignee: Jeol Ltd., Tokyo (JP)

( * ) Notice: Subject to any disclaimer, the term of this patent is extended or adjusted under 35 U.S.C. 154(b) by 322 days.

This patent is subject to a terminal disclaimer.

(21) Appl. No.: 12/023,443

(22) Filed: Jan. 31, 2008

(65) Prior Publication Data
US 2008/0308731 A1   Dec. 18, 2008

(30) Foreign Application Priority Data

Jan. 31, 2007   (JP)   ............................. 2007-020535
Apr. 23, 2007   (JP)   ............................. 2007-112570

(51) Int. Cl.
*G01N 1/28* (2006.01)
*G21K 5/08* (2006.01)
*H01J 37/20* (2006.01)

(52) U.S. Cl. ........................... 250/442.11; 250/440.11; 250/306; 250/307; 250/310; 250/311; 250/309; 73/864.91

(58) Field of Classification Search ............ 250/442.11, 250/440.11, 306, 307, 310, 311, 309; 73/864.91
See application file for complete search history.

(56) References Cited

U.S. PATENT DOCUMENTS 7,071,475 B2 *   7/2006   Tomimatsu et al.  .... 250/442.11

2003/0183776 A1*   10/2003   Tomimatsu et al. .... 250/442.11
2009/0242762 A1*   10/2009   Nishiyama et al. .......... 250/307
2009/0250609 A1*   10/2009   Nishiyama et al. .......... 250/306
2009/0314955 A1*   12/2009   Nishiyama et al. ..... 250/442.11

FOREIGN PATENT DOCUMENTS

JP   A-47-24961   10/1972
JP   06-318445   11/1994
JP   2004-515049   5/2004

OTHER PUBLICATIONS

Green, Evan Drake Harriman, Ph.D, Chapter 1. Introduction, Atmospheric Scanning Electron Microscopy, Stanford University, pp. 1-12, 1993.

* cited by examiner

*Primary Examiner*—Nikita Wells
(74) *Attorney, Agent, or Firm*—The Webb Law Firm

(57) ABSTRACT

A specimen holder, a specimen inspection apparatus, and a specimen inspection method permitting a specimen consisting of cultured cells to be observed or inspected. Also, a method of fabricating the holder is offered. The holder has an open specimen-holding surface. At least a part of this surface is formed by a film. A specimen cultured on the specimen-holding surface of the film can be irradiated via the film with a primary beam for observation or inspection of the specimen. Consequently, the cultured specimen (e.g., cells) can be observed or inspected in vitro. Especially, if an electron beam is used as the primary beam, the specimen in vitro can be observed or inspected by SEM. Because the specimen-holding surface is open, a manipulator can gain access to the specimen. A stimulus can be given to the specimen using the manipulator. The reaction can be observed or inspected.

25 Claims, 4 Drawing Sheets

SPECIMEN HOLDER, SPECIMEN INSPECTION APPARATUS, SPECIMEN INSPECTION METHOD, AND METHOD OF FABRICATING SPECIMEN HOLDER

BACKGROUND OF THE INVENTION

1. Field of the Invention

The present invention relates to specimen holder, specimen inspection apparatus, and specimen inspection method permitting a specimen consisting of cultured cells or the like to be observed or inspected. The present invention also relates to a method of fabricating the specimen holder.

2. Description of Related Art

In life science and pharmaceutical applications, it is important that stimuli (such as electricity, chemical substances, and medicines) are given to biological cells and that resulting reactions are observed. In the past, optical microscopes have been used for such observations. Manipulators have been used to give stimuli to the cells. However, important parts to be observed are frequently microscopic regions of less than 0.1 µm, which cannot be observed with optical microscopes.

For example, diseases arising from inability to exchange substances among biological cells normally include hypertension, diabetes insipidus, arrhythmia, muscular disorders, diabetes, and depression. Exchange of substances among cells is performed by ion channels having sizes of about 10 nm and existing in cell membranes. Because it is difficult to observe such ion channels with optical microscopes, there has been a demand for a technique enabling observation using a scanning electron microscope (SEM) having high resolution.

However, a specimen to be inspected with an inspection apparatus incorporating SEM capabilities is normally placed in a specimen chamber whose inside pressure has been reduced by vacuum pumping. The specimen placed in the specimen chamber, which, in turn, is placed in a reduced-pressure ambient in this way, is irradiated with an electron beam (charged-particle beam). Secondary signals, such as secondary electrons or backscattered electrons, produced from the specimen in response to the irradiation are detected.

In such inspection of a specimen using SEM, the specimen is exposed to a reduced-pressure ambient. Therefore, moisture evaporates from the specimen, so that the cells die. It has been impossible to observe reactions of living cells to a stimulus.

Accordingly, when an inspection is performed under the condition where the specimen contains moisture, it is necessary to prevent the specimen from being exposed to the reduced-pressure ambient; otherwise, moisture would evaporate from the specimen. One conceivable method of inspecting a specimen using SEM without exposing the specimen to a reduced-pressure ambient in this way consists of preparing a specimen holder (specimen capsule) whose opening (aperture) has been sealed off by a film, placing the specimen in the holder, and installing the holder in an SEM specimen chamber that is placed in the reduced-pressure chamber.

The inside of the specimen holder in which the specimen is placed is not evacuated. The film that covers the opening formed in the specimen holder (specimen capsule) can withstand the pressure difference between the reduced-pressure ambient inside the SEM specimen chamber and the ambient (e.g., atmospheric-pressure ambient) of the inside of the specimen holder that is not pumped down. Furthermore, the film permits an electron beam to pass therethrough (see JP-T-2004-515049).

When a specimen is inspected, an electron beam is directed at the specimen within the specimen capsule from outside the capsule via the film on the capsule placed in the SEM specimen chamber that is in the reduced-pressure ambient. Backscattered electrons are produced from the irradiated specimen. The backscattered electrons pass through the film on the capsule and are detected by a backscattered electron detector mounted in the SEM specimen chamber. Consequently, an SEM image is derived.

However, with this technique, the specimen is sealed in the closed space and so it has been impossible to give a stimulus to cells using a manipulator. Furthermore, where a specimen consisting of cells is sealed in the specimen capsule and then the cells are observed or inspected in vitro, there arises a problem.

In particular, the cells are previously adsorbed onto a laboratory dish. A culture medium is put over the cells. The cells are cultured in an ambient having a temperature of 36°-38° C. (normally 37° C.) and a carbon dioxide concentration of 3% to 10% (normally 5%). When the cells are observed, the cells are harvested from the dish and subcultured into the specimen capsule. However, the environment inside the specimen capsule is different from the environment inside the dish. Therefore, the possibility that the cells survive in the specimen holder (specimen capsule) is low. Furthermore, in the specimen capsule described in the above-cited JP-T-2004-515049, it is possible to put only about 15 µl of medium into the capsule. Because the ambient environments including pH and osmotic pressure vary in a short time, it has been difficult to culture the cells.

An example of a method of obtaining an SEM image by preparing a film withstanding the pressure difference between vacuum and atmospheric pressure, irradiating a specimen with an electron beam via the film, and detecting backscattered electrons produced from the specimen in this way is described also in Atmospheric scanning electron microscopy, Green, Evan Drake Harriman, Ph.D., Stanford University, 1993 (especially, Chapter 1: Introduction).

Examples in which two films of the structure described above are placed opposite to each other with a specimen interposed between the films and an image is acquired by a transmission electron microscope are described in JP-A-47-24961 and JP-A-6-318445. Especially, JP-A-47-24961 also states a case in which an SEM image of the specimen interposed between such films is acquired.

Morphological variations based on reactions of cells after a stimulus is given to the cells using a manipulator take place in microscopic regions within the cells. Therefore, the variations cannot be observed with an optical microscope. Hence, observation using SEM is essential. In order to observe the cells by SEM while maintaining the liquid, the specimen (cells) cultured on a laboratory dish is sealed in a specimen capsule. An electron beam is directed at the specimen via a film formed on the capsule, thus obtaining an image. However, the inside of the specimen capsule is a closed space. Consequently, it has been impossible to use a manipulator for giving a stimulus. Furthermore, the possibility that cells sealed in the capsule survive has been low.

SUMMARY OF THE INVENTION

It is an object of the present invention to provide specimen holder, specimen inspection apparatus, and specimen inspection method permitting a specimen consisting of cultured cells, for example, to be observed or inspected. It is another object of the present invention to provide a method of fabricating the specimen holder.

It is a more specific object of the present invention to provide a technique by which biological cells can be cultured for a long time and the specimen can be observed or inspected in vitro.

It is another object of the present invention to provide a technique by which a stimulus can be given to cultured cells using a manipulator and the specimen can be observed or inspected at this time.

A first specimen holder according to one embodiment of the present invention has an open specimen-holding surface. At least a part of the specimen-holding surface is formed by a film. A specimen cultured on the specimen-holding surface of the film can be irradiated via the film with a primary beam for observing or inspecting the specimen.

A second specimen holder according to another embodiment of the present invention has an open specimen-holding surface. At least a part of the specimen-holding surface is formed by a film. The film has a first surface forming the specimen-holding surface. The first surface is in contact with an open ambient. A specimen cultured on the first surface can be irradiated via the film with a primary beam from a side of the second surface which is in contact with a vacuum ambient for observing or inspecting the specimen.

A specimen inspection apparatus according to a further embodiment of the present invention uses any one of the aforementioned specimen holders to observe or inspect a specimen. The specimen inspection apparatus has placement means on which the specimen holder is placed, primary beam irradiation means for irradiating the specimen placed on the specimen-holding surface of the film of the specimen holder with a primary beam via the film, and signal detection means for detecting a secondary signal produced from the specimen in response to the beam irradiation.

A method of inspecting a specimen in accordance with one embodiment of the present invention starts with irradiating a specimen cultured on the specimen-holding surface of the above-described specimen holder with a primary beam via the film. A secondary signal produced from the specimen in response to the beam irradiation is detected.

A method of fabricating a specimen holder in accordance with one embodiment of the present invention starts with creating a frame-like member provided with an opening covered with a film. The frame-like member has a body portion provided with a hole in communication with the specimen-holding surface. Step portions are formed in the hole. The frame-like member is held to the step portions.

In the present invention, the specimen cultured on the film lying on the open specimen-holding surface can be irradiated with the primary beam for observation or inspection of the specimen via the film. Consequently, the cultured specimen consisting, for example, of biological cells can be well observed or inspected in vitro. Especially, if an electron beam is used as the primary beam, the specimen can be well observed or inspected in vitro by SEM.

Additionally, the specimen-holding surface is opened. This permits a manipulator to make contact with or gain access to the specimen. A stimulus can be given to the specimen using the manipulator. The resulting reaction can be observed or inspected.

These and other objects and advantages of the present invention will become more apparent as the following description proceeds.

DESCRIPTION OF THE PREFERRED EMBODIMENTS

Specimen holders, specimen inspection apparatus, and methods according to the present invention are hereinafter described with reference to the drawings.

Embodiment 1

Figure 1:
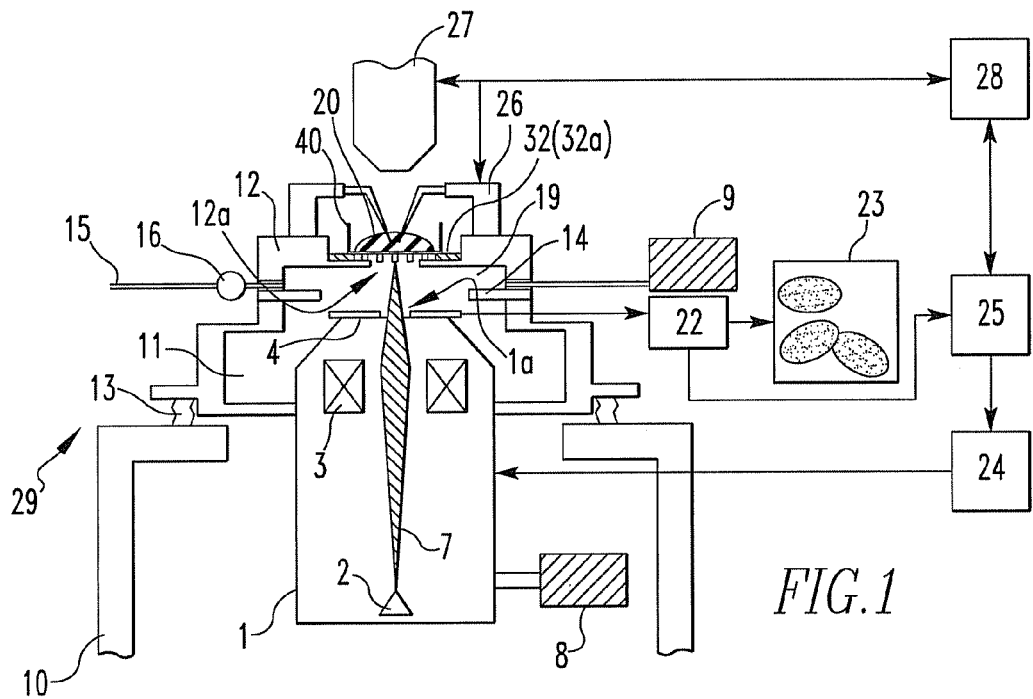
FIG. 1 is a schematic diagram illustrating a first embodiment of a specimen inspection apparatus according to the present invention.

FIG. 1 is a schematic diagram showing a first embodiment of a specimen inspection apparatus according to the present invention. In the figure, an electron gun 2 forming an electron source is disposed in an electron optical column 1 forming primary beam irradiation means. An electron beam (a kind of charged-particle beam) 7 acting as a primary beam is emitted from the electron gun 2 and accelerated. The beam 7 is focused by a condenser lens (objective lens) 3.

The electron beam 7 focused in this way is made to hit a sample 20 via a specimen-holding film 32 (described later). The sample 20 is held on a specimen holder 40. The film 32 is formed on the specimen holder 40. The sample 20 contains a specimen (biological cells in the present embodiment) and a liquid (a culture medium in the present embodiment).

During the irradiation, the electron beam 7 is deflected by deflection means (not shown). As a result, the beam 7 scans the sample 20. At this time, the specimen contained in the sample 20 is also scanned by the beam 7.

The front end of the electron optical column 1 is connected with a vacuum chamber 11. The base end of the electron optical column 1 in which the electron gun 2 is mounted is located below the vacuum chamber 11. Because of this structure, the electron beam 7 released from the electron gun 2 travels upward through the electron optical column 1 and passes through the space inside the vacuum chamber 11 by way of an opening 1a formed at the front end of the column 1 and then through the specimen-holding film 32. Then, the beam reaches the sample 20.

In this way, the electron optical column 1 forms the primary beam irradiation means. In the present embodiment, the column is an inverted electron optical column. A backscattered electron detector 4 is mounted inside the vacuum chamber 11 and near the front end of the column 1. The detector 4 detects backscattered electrons produced when the specimen inside the sample 20 is irradiated with the electron beam 7. For example, a semiconductor detector utilizing a PN junction or a scintillator detector utilizing a YAG crystal is used as the backscattered electron detector 4.

The inside of the electron optical column 1 is evacuated to a given pressure by vacuum pump 8. Furthermore, the inside of the vacuum chamber 11 is evacuated to a given pressure by vacuum pump (not shown). The vacuum chamber 11 is placed over a pedestal 10 via a vibration-proofing device 13.

A specimen holder placement portion 12 is formed on top of the vacuum chamber 11 and provided with a hole 12a to permit passage of the electron beam 7. A specimen holder 40 is placed on the placement portion 12 via an O-ring (not shown). Consequently, the specimen holder 40 is withdrawably supported in the vacuum chamber 11.

Figure 2:
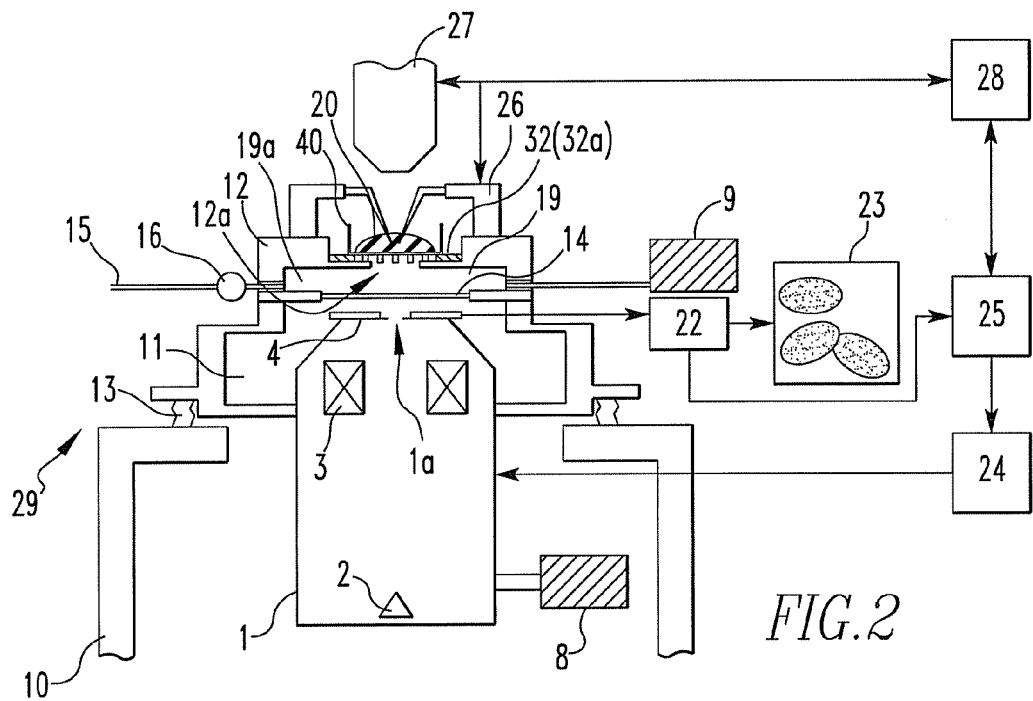
FIG. 2 is a schematic diagram similar to FIG. 1, showing a different state.

An open-close valve 14 is mounted in the vacuum chamber 11 near its top portion and used to partition off the space 19 between the specimen holder 40 and the front end of the electron optical column 1 (primary beam irradiation means) within the vacuum chamber 11. In FIG. 1, the open-close valve 14 is opened. When the valve 14 is closed, the space 19 is partitioned off in the vacuum chamber 11 as shown in FIG. 2. When the space 19 is partitioned off by the open-close valve 14 in this way, a closed space 19a is formed between the valve 14 and the specimen-holding film 32. The closed space 19a is partitioned by the valve 14 on its one side and located on the side of the specimen holder 40.

Vacuum pump 9 (pressure-reducing means) is in communication with the closed space 19a. The vacuum pump 9 can evacuate the closed space 19a independently. Gas supply means (not shown) is connected with the closed space 19a and supplies a gas, such as nitrogen or air, into the closed space 19a to return the closed space 19a from a pressure-reduced state to normal-pressure (atmospheric-pressure) state. In consequence, the closed space 19a can be returned from the reduced-pressure state to the normal-pressure state independently.

Cleaning means (not shown) is connected with the closed space 19a to supply a cleaning agent into the closed space 19a, for cleaning it. As a result, the wall surface defining the closed space 19a is cleaned.

The used cleaning agent is a cleaning liquid consisting of at least one of a detergent, ethanol, alcohol, acetone, and aqueous hydrogen peroxide. Alternatively, vapors of these materials may be used. The cleaning agent supplied in the closed space 19a is discharged from it through a discharge tube 15 after the cleaning. The open-close valve 16 is mounted in the discharge tube 15. The open-close valve 16 is opened to permit the cleaning agent to be discharged to the outside through the discharge tube 15. When inspection (described later) of the specimen is carried out, the valve 16 is closed.

The closed space 19a can be disinfected without using the cleaning agent by irradiating the closed space 19a with ultraviolet radiation or other radiation.

Figure 3:
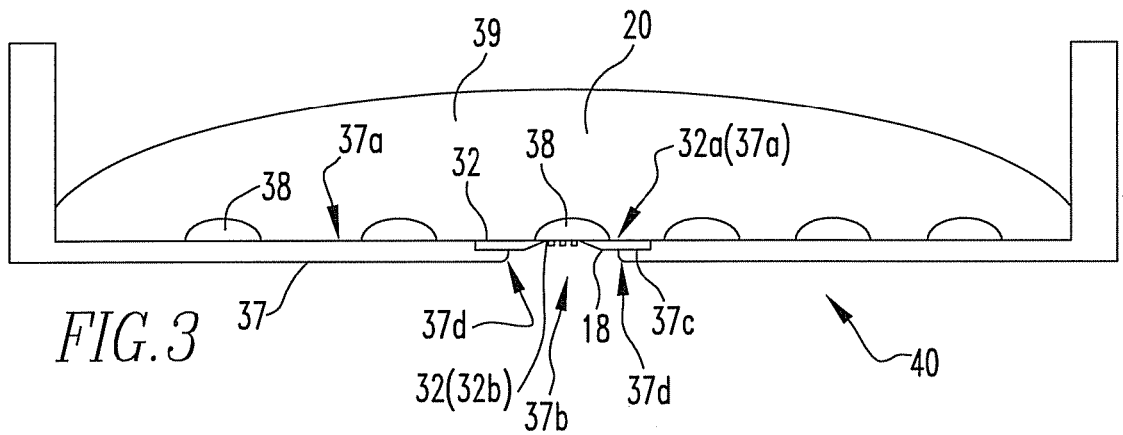
FIG. 3 is a cross-sectional view showing the structure of a specimen holder according to one embodiment of the present invention.

The specimen holder 40 is constructed as shown in FIG. 3. The specimen holder 40 is composed of a dish-like body portion 37 made of plastic or glass and a film holder (frame-like member) 18 on which the specimen-holding film 32 is formed. The film 32 transmits the electron beam 7. A recessed portion is formed inside the body portion 37. The bottom surface of the recessed portion forms a specimen-holding surface 37a that is open.

The specimen-holding surface 37a of the body portion 37 is (centrally in the example of FIG. 3) provided with a through-hole 37b. Step portions 37c are formed in the hole 37b on the side of the specimen-holding surface 37a. The film holder 18 is disposed on the step portions 37c and has the specimen-holding film 32. The specimen-holding film 32 has a first surface 32a that forms the specimen-holding surface 37a. The specimen-holding surface 37a is substantially flush with the specimen-holding surface 37a of the body portion 37. Consequently, at least a part of the specimen-holding surface 37a of the specimen holder 40 is constituted by the specimen-holding film 32.

Tapering portions 37d are formed on the side of the hole 37b on the opposite side of the specimen-holding surface 37a. The tapering portions 37d spread apart toward the surface on the opposite side of the specimen-holding surface 37a. The spread angle is set to 90° to 120°.

Figure 4A:
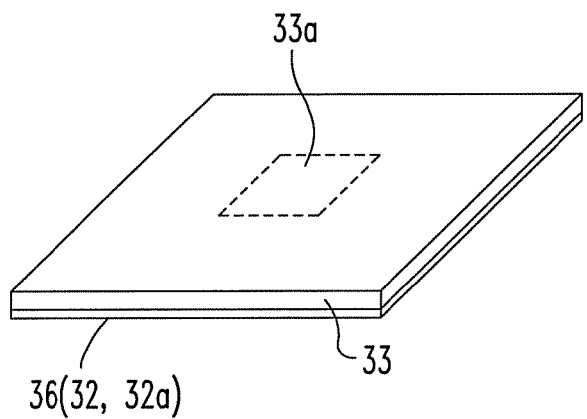
FIGS. 4A and 4B show perspective views illustrating a method of creating a frame-like member forming a specimen holder according to one embodiment of the present invention.
Figure 4B:
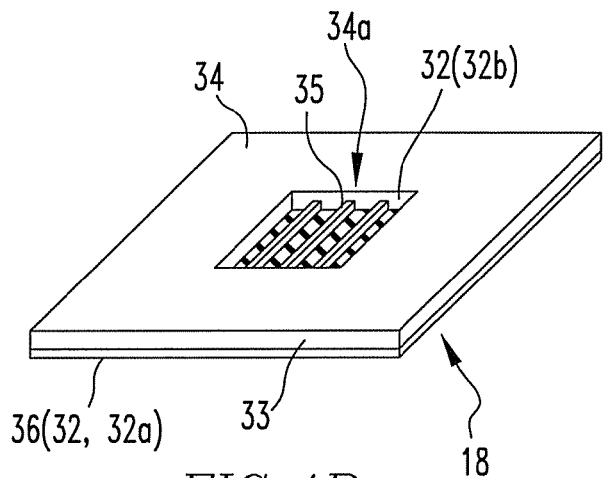

The specimen-holding film 32 is formed in the film holder 18 as shown in FIG. 4B. The first surface 32a (the lower surface in FIG. 4B; in FIG. 3, the upper surface) of the film 32 is exposed. The sample 20 containing a liquid, such as a culture medium and a specimen (cells), is disposed on the first surface 32a (specimen-holding surface) of the specimen-holding surface 32. Since the first surface 32a is under atmospheric pressure, evaporation of moisture from the sample 20 can be suppressed to a minimum.

The film holder 18 has a base plate portion 34 formed on a second surface 32b (upper surface in FIG. 4B; in FIG. 3, the lower surface) of the specimen-holding film 32. The base plate portion 34 is centrally provided with an opening 34a covered with the specimen-holding film 32. A central portion of the second surface 32b of the specimen-holding film 32 is exposed to the inside ambient of the vacuum chamber 11 through the opening 34a. The first surface 32a of the specimen-holding film 32 is exposed to the atmospheric-pressure ambient, while the second surface 32b is exposed to the vacuum ambient. In order to withstand the pressure difference, the film 32 is supported and reinforced with a lattice 35 if necessary.

A method of creating the film holder 18 is next described. First, as shown in FIG. 4A, a base plate having a silicon layer 33 and a silicon nitride film 36 formed on one surface (the lower surface in the figure) of the silicon layer 33 is prepared. The silicon layer 33 forms the base plate portion 34. The silicon nitride film 36 is grown on the silicon layer 33 (base plate portion 34) by a chemical vapor deposition, such as plasma-assisted CVD. The first surface (lower surface in the figure) of the silicon nitride film 36 is exposed, while the second surface of the silicon nitride film 36 is covered with the silicon layer 33. The silicon nitride film 36 forms the specimen-holding film 32 of the film holder 18.

Then, a central portion 33a of the other surface (upper surface) of the silicon layer 33 in FIG. 4A is selectively etched. As a result, the opening 34a is formed in the central portion 33a of the silicon layer 33 as shown in FIG. 4B. Consequently, parts of the second surface of the silicon nitride film 36 are exposed through the opening 34a. The opening 34a is covered with the silicon nitride film 36. At this time, to reinforce the silicon nitride film 36, plural portions of the lattice 35 of silicon are left in the opening 34a. Where the silicon nitride film 36 has sufficient strength, the lattice 35 is not necessary. In the opening 34a, the second surface of the silicon nitride film 36 is exposed through the portions where the lattice 35 is not present. The silicon nitride film 36 forms the specimen-holding film 32 of the film holder 18. The second surface of the silicon nitride film 36 corresponds to the second surface 32b of the specimen-holding film 32. In this way, the film holder 18 is created from the frame-like member having the opening 34a.

The film holder 18 created in this way is turned upside down from the state of FIG. 4B. The first surface of the silicon nitride film 36 that is the specimen-holding film 32 is made to face upward, i.e., becomes the upper surface. The first surface of the silicon nitride film 36 facing upward becomes the first surface 32a of the specimen-holding surface 32 of the film holder 18. The second surface 32b may also be made to face upward.

The film holder 18 is firmly held to the step portions 37c in the hole 37b formed in the body portion 37 forming the specimen holder 40. Thus, the specimen holder 40 is created. The film holder 18 can be firmly held to the step portions 37c by bonding using a silicone-based adhesive or by fusion making use of heat, ultrasonic waves, or laser. Consequently, the film holder 18 is firmly held in a position corresponding to the hole 37b in the specimen-holding surface 37a of the body portion 37.

In the present embodiment, the body portion 37 and film holder 18 are combined to fabricate the specimen holder 40. The specimen-holding film 32 may be directly, firmly bonded to the body portion 37. The body portion 37 and the specimen-holding film may be fabricated integrally. Furthermore, cell adhesion molecules (described later) acting as molecules for bonding the specimen may be applied to the specimen-holding surface 37a including at least the first surface 32a of the specimen-holding film 32.

The thickness of the silicon nitride film 36 is set to a range of from 10 to 1,000 nm. The specimen-holding film 32 of the film holder 18 is made of silicon nitride. In addition, the film 32 may be made of silicon oxide, boron nitride, polymer, polyethylene, polyimide, polypropylene, or carbon. Where films of these materials are used, their film thicknesses are set to a range of from 10 to 1,000 nm. The specimen-holding film 32 made of the aforementioned material transmits the electron beam 7 but does not transmit gas or liquid. Moreover, it is necessary that the film be capable of withstanding a pressure difference of at least 1 atmosphere across the opposite surfaces. As the thickness of the specimen-holding film 32 is reduced, scattering of the electron beam 7 is reduced and, therefore, the resolution is improved but the film is more easily damaged. As the thickness is increased, scattering of the electron beam 7 increases, resulting in decreased resolution. However, the film is less likely to be damaged. The preferable thickness of the film is 20 to 200 nm.

Figure 6:
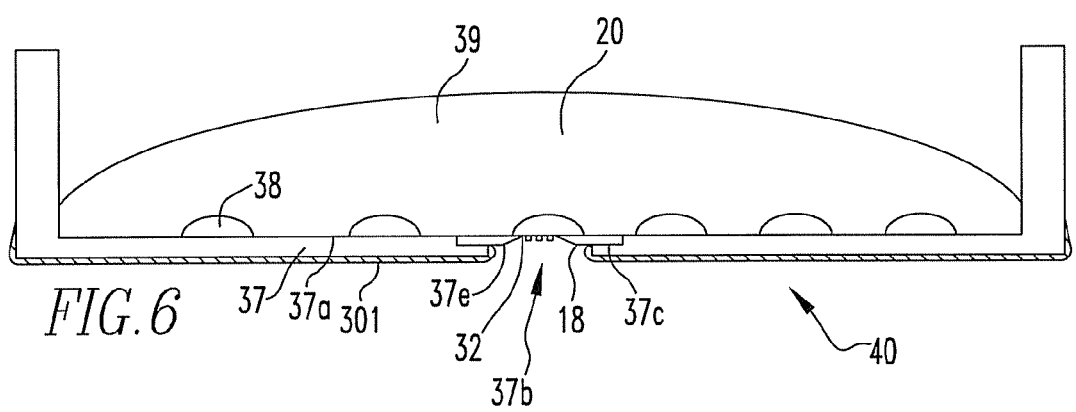
FIG. 6 is a cross-sectional view of the structure of a first modification of the specimen holder according to the present invention.

As shown in FIG. 6, a region of the lower surface of the specimen holder 40 on the opposite side of the specimen-holding surface 37a might be exposed to a vacuum ambient and become irradiated with the electron beam 7. A conductive film 301 may be formed on this region to prevent charging of the specimen holder 40 when it is irradiated with the beam 7. Furthermore, the body portion 37 may be made of a conductive plastic.

The conductive film 301 makes contact with the specimen holder placement portion 12 of the specimen inspection apparatus, so that the film is electrically connected with the placement portion 12. As a result, the conductive film 301 can be grounded. Consequently, electric charge accumulated on the specimen holder 40 by irradiation by the electron beam 7 can be escaped to the specimen holder placement portion 12 made of a metal.

Furthermore, the charge can also be escaped to the sample 20 via the film holder 18 because the conductive film 301 is in contact with the film holder 18 made of silicon. At this time, accumulation of electric charge on the specimen holder 40 can be prevented with certainty by bringing a grounding line or a manipulator (described later) into contact with the sample 20.

Tapering portions 37e are formed in side surfaces of the opening 34a (see FIG. 3) of the film holder 18. The tapering portions 37d spread toward the lower surface of the specimen holder 40.

Charging of the lower surface of the specimen holder 40 can be reduced by forming the conductive film 301 in this way. When the electron beam 7 is made to hit the sample 20, deviation of the trajectory of the beam 7 or deviations of trajectories of backscattered electrons take place. It is assured that distortion of the SEM image and generation of brightness spots due to these deviations are prevented.

The conductive film 301 can be formed by depositing a metal, such as aluminum or gold, onto the lower surface of the specimen holder 40. Alternatively, silver paste or conductive plastic may be applied to the lower surface.

Figure 7:
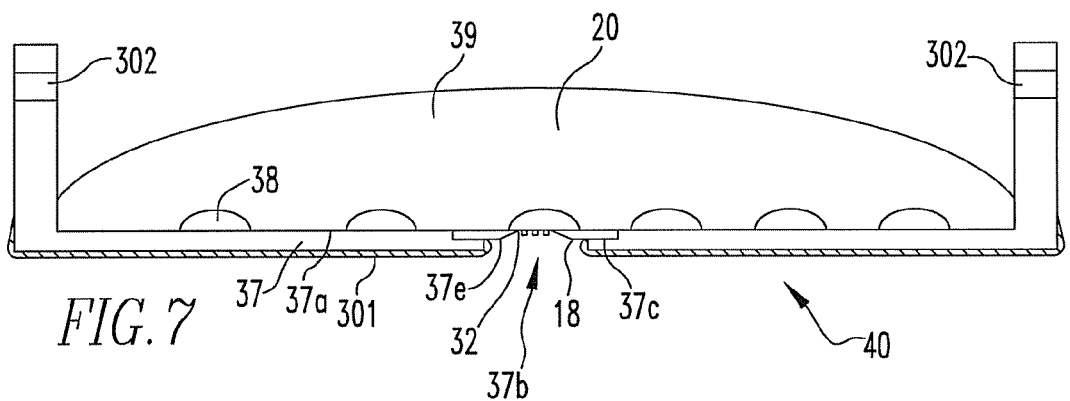
FIG. 7 is a cross-sectional view of the structure of a second modification of the specimen holder according to the present invention.
Figure 8:
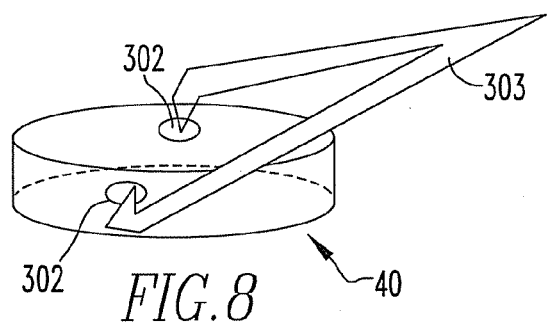
FIG. 8 is a perspective view of a specimen holder of the second modification.

To facilitate removing the specimen holder 40 from the specimen holder placement portion 12 of the specimen inspection apparatus, two holes 302, for example, may be formed in side surfaces of the specimen holder 40 as shown in FIG. 7. The holes 302 permit the specimen holder 40 to be removed easily from the specimen holder placement portion 12 by causing tweezers to be caught into the holes 302 as shown in FIG. 8.

In the present embodiment, the holes 302 are formed in side surfaces of the specimen holder 40. Instead of holes, grooves may be formed. Furthermore, one side surface of the specimen holder 40 and the specimen holder placement portion 12 may be threaded, and the holder 40 may be screwed into the holder placement portion 12.

Figure 9:
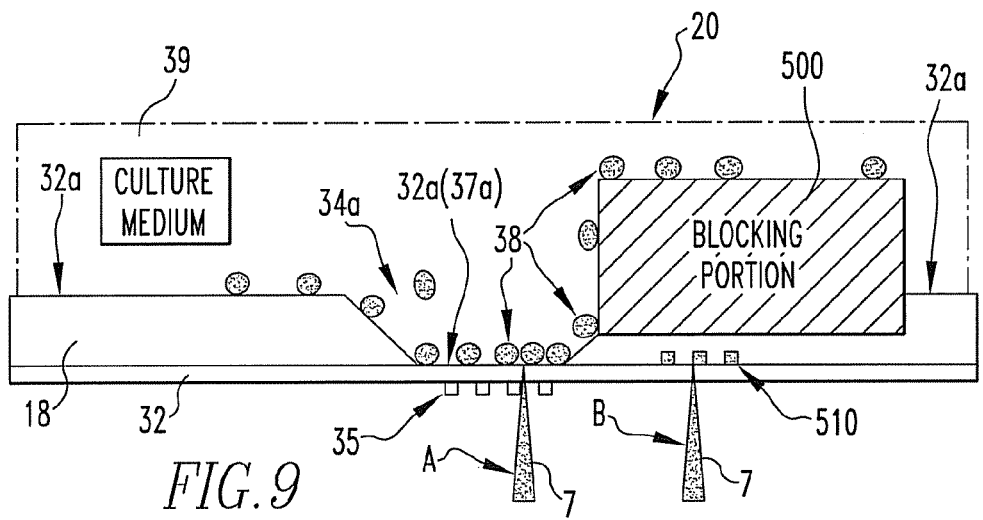
FIG. 9 is a cross-sectional view of main portion of a third modification of the specimen holder according to the present invention.

As shown in FIG. 9, a pattern 510 for adjustment of a primary beam can be formed on the side of the specimen-holding film 32 closer to the specimen-holding film 32 that is held to the film holder 18. The pattern 510 is formed on the side of the specimen-holding surface 32a but does not lie in the position of the opening 34a formed in the film holder 18 formed to expose a part of the specimen-holding surface 32a of the specimen-holding film 32. The pattern 510 is located at the junction of the film holder 18 and the specimen-holding film 32. The structure shown in FIG. 9 is obtained by turning the film holder 18 shown in FIGS. 3, 6, and 7 upside down. The surface 32a (upper surface) of the specimen-holding film exposed through the opening 34a in FIG. 9 is the specimen-holding surface 32a.

The pattern 510 is made of a metal, such as iron, copper, zinc, or gold, an alloy including at least two of these metals, or a light element, such as carbon. The pattern may also be made of a carbon compound, NaCl, potassium, a protein, or other substance constituting a living organism. The pattern is buried as a line pattern in the film holder 18, the pattern extending in a vertical direction to the plane of the paper of FIG. 9. Where the pattern is made of carbon, the pattern may be made of carbon nanotubes or fullerene. Furthermore, the pattern may be made of lines of grooves formed in the film holder 18. As described later, the pattern 510 is irradiated with the electron beam 7 via the specimen-holding film 32. In FIG. 9, only three lines of the pattern 510 are shown for simplicity.

When the pattern 510 described above is formed, the pattern 510 is first formed in a corresponding position on the film holder 18. Then, the specimen-holding film 32 is deposited on the surface of the film holder 18 where the pattern 510 is formed.

An X-ray blocking portion 500 is formed on the side of the film holder 18 closer to the specimen-holding surface 32a to cover the region in which the pattern 510 is formed. The blocking portion 500 is made of a metal, such as iron, copper, zinc, silver, tin, lead, or gold. Alternatively, the blocking portion 500 is made of an alloy.

When the pattern 510 is irradiated with the electron beam 7, the X-ray blocking portion 500 blocks X-rays emitted from the pattern 510 from reaching a specimen 38 existing in a culture medium 39 for the sample 20 and consisting of biological cells. That is, if the X-rays reach the specimen 38, the specimen 38 will be damaged. Therefore, the X-ray blocking portion 500 is preferably made of a substance having a high mass absorption coefficient for X-rays. That is, if a substance having a higher atomic number is selected, the mass absorption coefficient for X-rays is generally increased with desirable results.

A protective film (not shown) is coated on the surface of the X-ray blocking portion 500. The protective film is made of silicon nitride or silicon oxide and used to prevent direct contact between the X-ray blocking portion 500 and the specimen 38 or culture medium 39. That is, if the X-ray blocking portion 500 made of a metal or alloy touches the specimen 38 or culture medium 39, there is the possibility that the metal component of the X-ray blocking portion 500 affects the specimen 38 or culture medium 39. To prevent this, the protective film is formed.

A grounding line (not shown) can be connected with the X-ray blocking portion 500. Consequently, the X-ray blocking portion 500 can be grounded. Hence, during irradiation by the electron beam 7, charging of the film holder 18 can also be prevented. A lattice 35 reinforces the specimen-holding film 32.

When a specimen inspection is performed using the specimen holder 40 of the structure shown in FIG. 9, a region in which the pattern 510 is formed is first brought into the optical axis of the electron beam 7. Then, the pattern 510 is irradiated with the beam 7 via the specimen-holding film 32 as shown in (B) of FIG. 9. At this time, the region in which the pattern 510 is formed is scanned with the beam 7.

Backscattered electrons produced from the pattern 510 in response to the beam irradiation are detected by a backscattered electron detector 4 equipped in the specimen inspection apparatus, and a scanned image is created. The operator can adjust conditions under which the electron beam 7 is directed while checking the scanned image. The beam 7 is adjusted for the focus or astigmatism of the beam 7.

At this time, where the pattern 510 is made of a metal, more backscattered electrons are produced and so a scanned image with good contrast is derived. The electron beam 7 can be adjusted well. Where the specimen 38 is a biological sample, such as biological cells, the beam 7 can be adjusted in a corresponding manner to carbon contained in large amounts in biological samples by forming the pattern 510 out of carbon or a carbon compound.

Since the pattern 510 is placed over the specimen-holding film 32 in the same way as the specimen 38 (to be inspected) lying over the specimen-holding film 32 in the opening 34a of the film holder 18, the illumination conditions, such as focusing conditions, for the electron beam 7 during inspection of the specimen 38 can be adjusted optimally.

After preadjusting the illumination conditions for the electron beam 7 in this way, the specimen holder 40 is moved inside the specimen holder placement portion 12 to bring the opening 34a into the optical axis of the beam 7. Under this condition, the specimen 38 on the specimen-holding film 32 is irradiated with the beam 7 via the specimen-holding film 32 (in (A) of FIG. 9). The specimen 38 is inspected.

Referring back to FIG. 1, the structure of the specimen inspection apparatus is further described. An output signal produced from the backscattered electron detector 4 in response to detection of electrons is fed to an image-forming device 22 disposed outside the vacuum chamber 11. The image-forming device 22 creates image data based on the detector output signal. The image data becomes image data corresponding to the SEM image. The image data is fed to a display device 23, which, in turn, displays an image based on the incoming image data. The displayed image becomes an SEM image.

The image data created by the image-forming device 22 is sent to a computer 25 if necessary. The computer 25 performs image processing on the image data and makes a decision based on the result of the image processing.

An electron beam instrumental portion 29 equipped with the electron optical column 1 and the vacuum chamber 11 is located below the specimen holder 40, and is controlled by an electron beam controller 24. A manipulator 26 for giving a stimulus (such as a voltage, chemical substance, or medicine) to the specimen and for moving the specimen if necessary and an optical microscope 27 are placed on the specimen holder placement portion 12. The microscope 27 permits one to observe the specimen and to check the position of the manipulator 26. These components are controlled by an overall controller 28.

The optical axis of the optical microscope 27 is coincident with the optical axis of the electron beam 7. Alternatively, the center of field of view of the optical microscope 27 is coincident with the center of field of view of the SEM image. A region observed by the optical microscope can be made substantially coincident with the SEM image. The field of view of the SEM image and the field of view of the optical microscope 27 can be adjusted by moving the specimen holder placement portion 12.

The specimen inspection apparatus according to the present invention has the electron beam instrumental portion 29, manipulator 26, optical microscope 27, electron beam controller 24, overall controller 28, image-forming device 22, and display device 23. These portions are connected with the computer 25. Information can be exchanged between these portions.

An inspection method according to the present invention is next described by referring to FIGS. 1, 2, and 3. First, as shown in FIG. 3, cells 38 becoming a specimen are cultured in culture medium 39, using the specimen holder 40. In order to culture the cells 38 as shown in FIG. 3, it is necessary to subculture the cells from the dish where the cells are being cultured to the specimen holder 40 in advance. For this purpose, a normal method described below is used.

That is, the culture medium is discarded from inside the dish where the cells have been previously cultured. Then, a trypsin-EDTA (ethylene diamine tetraacetic acid) mixture is put into the dish, thus harvesting the cells adsorbed onto the dish.

Then, the harvested cells are recovered into a centrifuge tube and a culture medium is added. The trypsin is deactivated. The liquid is then centrifuged. Subsequently, the supernatant fluid is discarded from inside the tube, and the liquid is stirred with the culture medium. A part (e.g., 1/10) of the stirred liquid including the cells 38 is put into the specimen holder 40, and further culture medium 39 is added. Under this condition, the liquid is allowed to stand in a specimen chamber. The cells 38 may be adsorbed onto the specimen-holding surface 37a including the surface 32a of the specimen-holding film 32 of the specimen holder 40 in several hours (which may differ according to different cells) and begin to proliferate. Consequently, the cells 38 becoming a specimen to be observed or inspected are cultured within the specimen holder 40. It follows that the sample 20 including the cultured cells 38 and culture medium 39 is constituted.

Depending on cells, if cell adhesion molecules (molecules for sticking the specimen) are applied to the specimen-holding surface 37a of the specimen holder 40 (especially, the first surface (specimen-holding surface) 32a of the specimen-holding surface 32 that is a region to be observed using an electron beam), it is easy to culture the cells. The cell adhesion molecules act to adsorb cells arranged for culturing and cells proliferated by culturing onto the specimen-holding surface. Examples of the cell adhesion molecules include collagen, fibronectin, vitronetin, cadherin, integrin, claudins, desmogleins, neuroligin, neurexin, selectin, laminins, and poly-L-lysine. The cells are adhered to the specimen-holding film 32 via such cell adhesion molecules. Consequently, when the cells are irradiated with the electron beam 7 via the specimen-holding film 32, a deterioration of the resolution due to scattering of the beam 7 can be suppressed to a minimum.

After the cells becoming a specimen are cultured in the specimen holder 40 as described previously, the holder 40 is placed on the specimen holder placement portion 12. At this time, the open-close valve 14 is closed and in the state shown in FIG. 2. The closed space 19a closed between the open-close valve 14 and the specimen-holding film 32 is in an atmospheric-pressure ambient that is normal pressure. The space located under the valve 14 within the vacuum chamber 11 is in a given vacuum state (reduced-pressure state). The inside of the electron optical column 1 in communication with this space is evacuated by the vacuum pump 8 and reduced in pressure. The inside of the column 1 is in a given vacuum state. The pressure (degree of vacuum) inside the vacuum chamber 11 is set to about $10^{-3}$ to $10^{-4}$ Pa, for example. The pressure (degree of vacuum) inside the electron optical column 1 (especially, around the electron gun 2) is set to about $10^{-4}$ to $10^{-5}$ Pa, for example.

Under this condition, the closed space 19a is reduced in pressure down to a vacuum using the pump 9. At this time, to prevent the specimen-holding film 32 from being damaged due to rapid pressure variations from the atmospheric-pressure state, the pressure is reduced from 1 atm. (101325 Pa), that is, the atmospheric pressure down to about ½ to ¹⁄₁₀ atm. (50 kPa to 10 kPa), using a needle valve (not shown), in a time from 1 second to 100 seconds. During this process step, it is checked that the specimen-holding film 32 of the specimen holder 40 is not destroyed.

After checking that the specimen-holding film 32 has not been destroyed by the above-described step, the positions of the cells (specimen) 38 and of the manipulator 26 are checked with the optical microscope 27. Microelectrodes and a glass microtube are installed at the front end of the manipulator. When a voltage is applied by the microelectrodes, a liquid can be made to flow in and out through the glass microtube.

Under this condition, the manipulator 26 is moved while making an observation with the optical microscope 27 to bring the cells 38 close to the glass microtube. Then, a negative pressure is applied to the glass microtube to bring it into intimate contact with the cell membranes. As a result, potential response can be measured.

When the manipulator 26 is moved as described above, if the specimen-holding film 32 is erroneously damaged, contamination due to diffusion of the sample 20 is restricted to within the closed space 19a because the open-close valve 14 is closed. If the specimen-holding film 32 should be destroyed, and if the inside of the closed space 19a were contaminated due to diffusion of the sample 20, the closed space 19a can be cleaned as mentioned previously.

The liquid or vapor that is the cleaning agent used for the cleaning can be discharged via the discharge tube 15 and discarded by opening the open-close valve 16. The contamination can be suppressed by coating the wall surface forming the closed space 19a with boron nitride or fluororesin.

After confirming that the specimen-holding film 32 holding the sample 20 thereon is not destroyed when the closed space 19a is in a reduced-pressure (vacuum) state, the open-close valve 14 is opened. Consequently, the space in the vacuum chamber 11 is ceased to be partitioned off. This places the lower space in the vacuum chamber 11 into communication with the closed space 19a. Then, the light illumination for the optical microscope 27 is ceased to prevent the light from entering the backscattered electron detector 4 via the specimen-holding film 32. Other extraneous light is blocked by shielding (not shown). The shielding also acts to provide radiation protection against radiation produced when the electron beam 7 falls on the film holder 18 and sample 20.

Then, as shown in FIG. 1, the electron beam 7 is directed from the electron optical column 1 toward the sample 20 including the cells 38, and imaging is performed. The beam 7 is transmitted through the specimen-holding film 32 of the specimen holder 40 and falls on the cells 38. Backscattered electrons produced from the cells 38 in response to the irradiation are detected by the backscattered electron detector 4.

Since the aforementioned tapering portions 37d are formed in the hole 37b of the body portion 37 forming the specimen holder 40, collision of the backscattered electrons against the inner side surface of the hole 37b can be suppressed to a minimum. That is, the backscattered electrons can be suppressed from being blocked. The backscattered electrons can be detected efficiently by the backscattered electron detector 4.

A detection signal produced from the backscattered electron detector 4 is fed to the image-forming device 22, which, in turn, forms image data based on the detection signal. Based on the image data, an image (SEM image) is displayed on the display device 23.

Subsequently, an electrical stimulus is given to the cells 38 using the microelectrodes installed at the front end of the manipulator 26. An SEM image is acquired in the same way as in the above-described process step. The response of the cells 38 to the stimulus is checked.

After the imaging, the open-close valve 14 is closed to prevent contamination of the electron optical column 1 if the specimen-holding film 32 should be destroyed. Before a variation caused by application of a stimulus to the cells 38 is observed by SEM as described above, an observation may be made with the optical microscope 27. At this time, if the open-close valve 14 is closed, risk of contamination occurring when the specimen-holding film 32 is destroyed can be reduced. In these cases, if the open-close valve 14 is closed, risk of contamination can be reduced should the film be broken. In any case, the probability of contamination of the inside of the apparatus can be reduced by shortening the interval for which the open-close valve 14 is opened during inspection. This is achieved by closing the open-close valve 14 when the sample 20 is not irradiated with the electron beam 7.

Where the speed of reaction of the cells 38 to the stimulus is low, the open-close valve 14 may be once closed. The valve 14 may be again opened at a time when a reaction is deemed to have taken place. Then, imaging may be performed using the electron beam 7. The reaction can be checked with the optical microscope 27.

The manipulator 26 can have a mechanism capable of spraying a chemical substance or medicine into the sample 20. Behavior of the cells 38 in response to the chemical substance or medicine can be observed or inspected while observing the cells by SEM. Furthermore, a function of permitting a liquid to flow out can be imparted to the manipulator 26. This permits the sprayed substance to be recovered. Also, the pH of the culture medium and the osmotic pressure can be maintained constant.

In the foregoing, backscattered electrons are used to form an image. Backscattered electrons produce a signal intensity proportional to the atomic number. Therefore, where the specimen is almost totally made of substances of low atomic numbers, such as a biological sample, the image contrast is very low, and it is difficult to improve the resolution.

Accordingly, a heavy metal, such as gold, may be adsorbed onto portions of the cells 38 to be noticed in their behavior. In particular, gold is adsorbed onto the portions (antigen) via an antibody by causing the antigen tagged with gold particles having the nature of being adsorbed on the portions (antigen) to be sprayed against the cells by making use of an antigen-antibody reaction. Furthermore, a fluorescent dye or quantum dots (e.g., nanoparticles of Si or particles of CdSe coated with ZnS and having sizes of 10 to 20 nm) that emit light when irradiated with an electron beam may be previously adsorbed onto certain portions of the cells 38, and the emitted light may be observed with an optical microscope.

In the above embodiment, normally used gold particles have particle diameters of 10 to 30 nm. However, the adsorptive force between the antibody and gold particles is weak, and gold particles of 10 to 30 nm may not be attached. In this case, very small gold particles (nanogold particles) having particle diameters of the order of nanometers are first attached to the antibody. Under this condition, the gold particles are too small and it is difficult to observe them by SEM. Silver is adsorbed around the gold particles by making use of a silver sensitizer. This makes it easier to detect them by SEM.

In the foregoing, cells previously cultured in a laboratory dish are taken out and subcultured onto the specimen holder 40. Then, the cells are cultured. Alternatively, cells may be taken from a living organism and directly placed on the specimen-holding surface 37a of the specimen holder 40. The cells may be cultured in the specimen holder 40.

Embodiment 2

Figure 5:
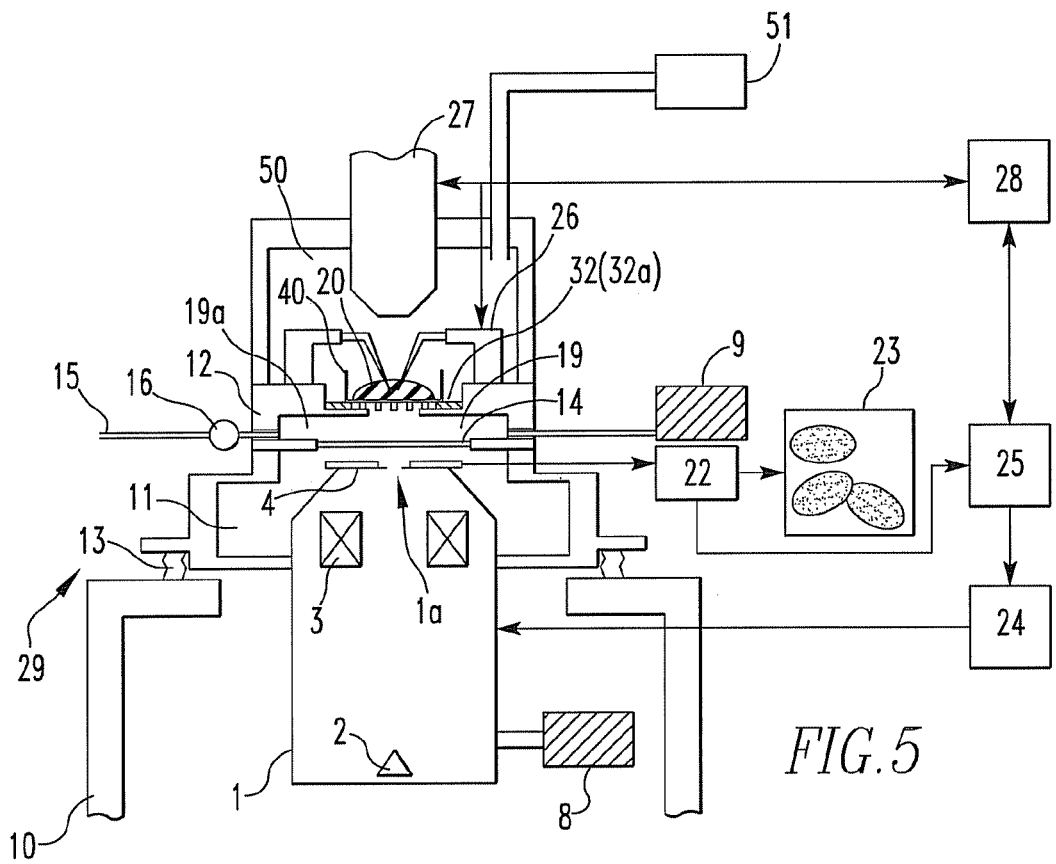
FIG. 5 is a schematic diagram illustrating a second embodiment of the specimen inspection apparatus according to the present invention.

As a second embodiment of the present invention, an apparatus permitting long-term observation of cells is shown in FIG. 5. A specimen chamber (incubator) 50 and a carbon dioxide gas cylinder 51 connected with the chamber 50 are mounted over a specimen holder placement portion 12. The specimen chamber 50 is kept at a constant temperature (e.g., 36° C. to 38° C., typically 37° C.) by a temperature-adjusting function (not shown). The concentration of the carbon dioxide is kept at a constant value, for example, of 3% to 10%, typically 5%, by the gas cylinder 51. Furthermore, the inside of the specimen chamber 50 contains a laboratory dish (not shown) filled with water or a culture medium to maintain the pressure inside the specimen chamber 50 close to the saturated aqueous vapor pressure.

Consequently, with the sample 20 located within the specimen chamber 50, long-term culturing of cells and SEM observation are possible. The specimen chamber 50 is also used to provide radiation protection against radiations caused by electron beam irradiation and to provide shielding against extraneous light.

In Embodiments 1 and 2 described so far, reactions of living cells to a stimulus can be observed and inspected at high resolution using SEM, which has been heretofore impossible to achieve. Furthermore, it is possible to use the specimen holder which permits cultured cells to be inspected in vitro with the specimen inspection apparatus. In addition, it is possible to perform a long-term observation by maintaining the surroundings of cells as an environment adapted for culturing of cells while mounting the specimen holder in the specimen inspection apparatus.

The cells referred to in the above embodiments are cells of various tissues including adrenal cortex, cardiac muscles, stomach, intestines, and blood vessels.

In the above embodiments, backscattered electrons are used as a secondary signal. Besides information about the specimen 38 consisting of cells can be obtained by detecting secondary electrons, X-rays, or cathode luminescence light produced in response to irradiation of the specimen 38 by the electron beam 7. Additionally, an electrical current absorbed by the specimen 38 in response to the irradiation can also be detected. Measurement of the absorption current can be performed conveniently if the manipulator 26 is used.

In the present embodiment, it is required that the specimen-holding film 32 withstand a pressure difference of at least 1 atm. and that gas or liquid do not flow in or out. Specifically, the material of the film 32 includes at least one of polymer, polyethylene, polyimide, polypropylene, carbon, silicon oxide, silicon nitride, and boron nitride.

In the above embodiments, an electron beam is used as the primary beam. If the specimen-holding film 32 shows sufficient shock resistance and strength against impingement of other charged-particle beams, such as a helium ion beam, the present invention can also be applied in a case where the other charged-particle beam is used. In the present invention, an inverted SEM is used. Depending on specimens, a normal, non-inverted SEM can be used without problem.

In this way, the specimen holder 40, according to the present invention, has the open specimen-holding surface 37a. At least a part of the surface 37a is made of the film (specimen-holding film) 32. The specimen 38 cultured on the first surface 32a (specimen-holding surface 37a) of the film 32 can be irradiated via the film 32 with the primary beam 7 for observation or inspection of the specimen.

In another feature of the present invention, the specimen holder 40, according to the present invention, has the open specimen-holding surface 37a. At least a part of the surface 37a is made of the film (specimen-holding film) 32. The specimen 38 is cultured on the first surface 32a (specimen-holding surface 37a) of the film 32 in contact with an open ambient. The specimen 38 can be irradiated via the film 32 with the primary beam 7 for observation or inspection of the specimen from a side of the second surface 32b of the film 32 in contact with a vacuum ambient.

The specimen holder 40 has the body portion 37 including the specimen-holding surface 37a provided with the hole 37b. The film 32 is disposed to cover the hole 37b.

The film 32 covers the opening 34a in the frame-like member 18 and is formed on the frame-like member 18. The frame-like member 18 is arranged in a corresponding manner to the hole 37b in the body portion 37. Especially, the frame-like member 18 is disposed on the step portion 37c formed in the hole 37b of the body portion 37. The frame-like member 18 and the body portion 37 are firmly coupled together by bonding using an adhesive or by fusion making use of heat, ultrasonic waves, or laser. The body portion 37 is made of a plastic or glass.

The tapering portions are formed on the side of the hole 37b created in the body portion 37 on the opposite side of the specimen-holding surface 37a. The spread angle of the tapering portions is set to 90° to 120°.

The specimen holder 40 is shaped like a dish. The bottom surface of the recessed portion forms the specimen-holding surface 37a. The volume of the inside of the specimen holder 40 capable of holding the sample 20 including the specimen 38 is more than 1 ml.

Preferably, the volume is set to a range from 1 ml to 20 ml. If the volume is in excess of 20 ml, contamination of the inside of the SEM when the film 32 is destroyed will become severer.

Molecules for adhesion of a specimen are disposed at least on the film 32 of the specimen-holding surface 37a. The molecules for adhesion of a specimen are made of at least one of collagen, fibronectin, vitronetin, cadherin, neuroligin, neurexin, selectin, integrin, claudins, desmogleins, laminins, and poly-L-lysine.

The thickness of the film 32 can be set between 10 nm and 1,000 nm or between 20 nm and 200 nm. The film 32 can be supported by the lattice 35. The film 32 is made of a material including at least one of polymer, polyethylene, polyimide, polypropylene, carbon, silicon oxide, silicon nitride, and boron nitride. An electron beam or an ion beam can be used as the primary beam 7.

The conductive film 301 can be formed on at least a part of the surface of the specimen holder 40 on the opposite side of the specimen-holding surface 37a. The conductive film 301 can be grounded. A hole or groove can be formed in a side surface of the specimen holder 40.

The pattern 510 for adjustment of the primary beam can be formed on the side of the specimen holder 40 closer to the specimen-holding surface 32a of the specimen-holding film 32. The pattern 510 can be a line pattern or groove pattern made of carbon, a carbon compound, NaCl, potassium, a protein, a metal, or an alloy.

The blocking portion 500 made of a metal can be formed so as to cover the region on which the pattern 510 is formed. The blocking portion 500 can be grounded. Furthermore, a protective film can be coated on the blocking portion 500.

The specimen inspection apparatus, according to the present invention, is used to observe or inspect the specimen 38 using the specimen holder 40. The apparatus has: the placement portion 12 on which the specimen holder 40 is placed; the primary beam irradiation means 1 (electron optical column) for irradiating the specimen 38 with the primary beam 7 via the film 32, the specimen 38 being disposed on the specimen-holding surface 37a of the film 32 of the specimen holder 40; and the signal detection means 4 (electron detector) for detecting a secondary signal produced from the specimen 38 in response to the irradiation by the primary beam 7.

The vacuum chamber 11 is mounted to make the ambient a vacuum ambient, the former ambient being in contact with the surface of the film 32 of the specimen holder 40 on the opposite side of the specimen-holding surface 37a.

There is further provided the manipulator 26 having a front-end portion which can be brought close to or into contact with the specimen 38 disposed on the specimen-holding surface 37a of the film 32 of the specimen holder 40.

It is possible to provide the specimen chamber 50 for exposing the specimen 38 to a given ambient, the specimen 38 being disposed on the specimen-holding surface 37a of the film 32 of the specimen holder 40. The temperature of the ambient can be set to 36°-38° C. The concentration of carbon dioxide of the ambient can be set to 3% to 10%.

The primary beam 7 can be an electron beam or ion beam. The secondary signal can be any one kind of secondary electrons, backscattered electrons, absorption current, cathode luminescence light, and X-rays.

The specimen-holding surface 37a of the film 32 of the specimen holder 40 is the upper surface of the film 32. The opposite surface is the lower surface of the film 32.

There is further provided the optical image acquisition means (microscope) 27 for acquiring an optical image of the specimen 38 disposed on the specimen-holding surface 37a of the film 32 of the specimen holder 40.

In the specimen inspection method according to the present invention, the specimen 38 is cultured on the specimen-holding surface 37a of the specimen holder 40. The cultured specimen 38 is irradiated with the primary beam 7 via the film 32. A secondary signal produced from the specimen 38 in response to the beam irradiation is detected.

During irradiation by the primary beam 7, the surface opposite to the specimen-holding surface 37a of the film 32 of the specimen holder 40 is in contact with the vacuum ambient. The primary beam 7 is directed through the vacuum ambient.

During irradiation by the primary beam 7, the specimen 38 disposed on the specimen-holding surface 37a of the film 32 of the specimen holder 40 can be exposed to a given ambient having a temperature of 36° to 38° C. and a carbon dioxide concentration of 3% to 10%.

The primary beam 7 is an electron beam or ion beam. The secondary signal can be any one kind of secondary electrons, backscattered electrons, absorption current, cathode luminescence light, and X-rays.

The method of fabricating a specimen holder, in accordance with the present invention, starts with creating the frame-like member 18 having the opening 34a covered with the film 32. The frame-like member 18 is firmly secured at a position corresponding to the hole 37b formed in the specimen-holding surface 37a of the body portion 37. Especially, the frame-like member 18 is disposed on the step portions 37c formed in the hole 37b of the body portion 37. The frame-like member 18 and the body portion 37 can be firmly coupled together by bonding using an adhesive or by fusion making use of heat, ultrasonic waves, or laser.

Molecules for adhesion of a specimen are disposed at least on the film 32. The molecules for adhesion of a specimen can be at least one kind of collagen, fibronectin, vitronetin, cadherin, integrin, claudins, desmogleins, neuroligin, neurexin, selectin, laminins, and poly-L-lysine.

The film 32 is formed on the base plate portion 34 constituting the frame-like member 18. The opening 34a can be formed by selectively etching given locations on the base plate portion 34. Thus, the frame-like member 18 can be created. The film 32 can be made of a material including at least one of polymer, polyethylene, polyimide, polypropylene, carbon, silicon oxide, silicon nitride, and boron nitride.

In this way, in the present invention, the specimen 38 cultured on the film 32 located on the open specimen-holding surface 37a can be irradiated via the film 32 with the primary beam 7 for observation or inspection of the specimen.

Consequently, the cultured specimen 38, such as biological cells, can be observed or inspected in vitro. Especially, if an electron beam is used as the primary beam 7, the specimen 38 in vitro can be observed or inspected by SEM.

Further, the specimen-holding surface 37a is opened. This permits the manipulator 26 to make contact with or gain access to the specimen 38. A stimulus can be given to the specimen 38 using the manipulator 26. The reaction can be observed or inspected.

Having thus described our invention with the detail and particularity required by the Patent Laws, what is desired protected by Letters Patent is set forth in the following claims.

The invention claimed is:

1. A specimen holder comprising:
a body portion configured to close off an opening through which a primary beam passes via a vacuum ambient; and
a specimen-holding surface, at least a part of the specimen-holding surface being made of a film,
wherein a specimen cultured on the specimen-holding surface of the film can be irradiated via the film with a primary beam for observation or inspection of the specimen, while the specimen on the specimen-holding surface of the film is exposed to an atmospheric ambient.

2. A specimen holder comprising:
a body portion configured to close off an opening through which a primary beam passes via a vacuum ambient; and
a specimen-holding surface, at least a part of the specimen-holding surface being made of a film,
wherein the film has a first surface and a second surface, the first surface forming the specimen-holding surface, and
wherein a specimen cultured on the first surface of the film can be irradiated via the film with a primary beam from a side of the second surface which is in contact with said vacuum ambient for observation or inspection of the specimen, while the specimen on the specimen-holding surface of the film is exposed to an atmospheric ambient.

3. A specimen holder as set forth in claim 1 or 2, wherein said specimen holder has a body portion including the specimen-holding surface provided with a hole, and wherein said film is arranged to cover the hole.

4. A specimen holder as set forth in claim 3, wherein said film is formed on a frame-like member so as to cover the opening in the frame-like member, and wherein the frame-like member is disposed in a corresponding manner to the hole in the body portion.

5. A specimen holder as set forth in claim 4, wherein said frame-like member is disposed on step portions formed in the hole created in the body portion.

6. A specimen holder as set forth in claim 3, wherein said body portion is made of a plastic or glass.

7. A specimen holder as set forth in claim 3, wherein tapering portions are formed on the opposite side of a side of the hole which is formed in the body portion and which is located closer to the specimen-holding surface.

8. A specimen holder as set forth in claim 7, wherein said tapering portions have a spread angle set to 90°-120°.

9. A specimen holder as set forth in claim 1 or 2, wherein said specimen holder is shaped like a dish, and wherein the dish-like specimen holder has a recessed portion whose bottom surface forms the specimen-holding surface.

10. A specimen holder as set forth in claim 1 or 2, wherein a volume capable of holding a sample including a specimen is in a range of from 1 to 20 ml.

11. A specimen holder as set forth in claim 1 or 2, wherein said film has a thickness of 10 to 1,000 nm.

12. A specimen holder as set forth in claim 1 or 2, wherein said film is supported by a lattice.

13. A specimen holder as set forth in claim 1 or 2, wherein said film includes at least one of polymer, polyethylene, polyimide, polypropylene, carbon, silicon oxide, silicon nitride, and boron nitride.

14. A specimen holder as set forth in claim 1 or 2, wherein said primary beam is an electron beam or ion beam.

15. A specimen holder as set forth in claim 1 or 2, wherein a conductive film is formed on at least a part of a surface located on the opposite side of said specimen-holding surface.

16. A specimen holder as set forth in claim 1 or 2, wherein the specimen holder has a side surface provided with a hole or groove.

17. A specimen holder as set forth in claim 1 or 2, wherein a pattern for adjustment of the primary beam is formed on a side of said film closer to the specimen-holding surface.

18. A specimen inspection apparatus for observing or inspecting a specimen using a specimen holder as set forth in claim 1 or 2, said specimen inspection apparatus comprising:
placement means on which the specimen holder is placed;
primary beam irradiation means for irradiating the specimen with the primary beam via the film, the specimen being disposed on the specimen-holding surface of the film of the specimen holder; and
signal detection means for detecting a secondary signal produced from the specimen in response to the irradiation by the primary beam.

19. A specimen inspection apparatus as set forth in claim 18, further comprising a specimen chamber for exposing the specimen to a given ambient, the specimen being disposed on the specimen-holding surface of the film of the specimen holder.

20. A specimen inspection apparatus as set forth in claim 18, wherein said primary beam is an electron beam or ion beam, and wherein said secondary signal is any one kind of secondary electrons, backscattered electrons, absorption current, cathode luminescence light, and X-rays.

21. A specimen inspection apparatus as set forth in claim 18, wherein the specimen-holding surface of the film of said specimen holder is the upper surface of the film, while a surface on the opposite side is the lower surface of the film.

22. A specimen inspection method comprising the steps of:
preparing a specimen holder having a specimen-holding surface as set forth in claim 1 or 2, a specimen being cultured on the specimen-holding surface;
irradiating the specimen with a primary beam via the film; and
detecting a secondary signal produced from the specimen in response to the irradiation by the primary beam.

23. A specimen inspection method as set forth in claim 22, wherein during irradiation by the primary beam, the specimen disposed on the specimen-holding surface of the film of said specimen holder is exposed to a given ambient.

24. A specimen inspection method as set forth claim 22, wherein said primary beam is an electron beam or ion beam, and wherein said secondary signal is any one kind of secondary electrons, backscattered electrons, absorption current, cathode luminescence light, and X-rays.

25. A method of fabricating a specimen holder, comprising the steps of:
creating a frame-like member provided with an opening covered with a film;
creating a body portion configured to close off an opening through which a primary beam passes via a vacuum ambient and having a specimen-holding surface;
forming a hole in the body portion, the hole being in communication with the specimen-holding surface of the body portion;
forming step portions in the hole; and
securing the frame-like member on the step portions, so that an exposed surface of the film covering the opening of the frame-like member forms the specimen-holding surface.

* * * * *